United States Patent [19]

Hardy, Jr. et al.

[11] 4,142,116
[45] Feb. 27, 1979

[54] ADAPTIVE THRESHOLD CIRCUIT

[75] Inventors: Arthur H. Hardy, Jr.; Mark E. Preiser, both of Santa Barbara, Calif.

[73] Assignee: Hughes Aircraft Company, Culver City, Calif.

[21] Appl. No.: 798,211

[22] Filed: May 18, 1977

[51] Int. Cl.² ........................................... H03K 5/18
[52] U.S. Cl. .................................. 307/350; 307/355;
 307/362; 307/364; 328/147; 328/104; 328/165
[58] Field of Search ............... 307/355, 357, 364, 358,
 307/260, 231, 350; 328/117, 147, 149, 151, 162,
 163, 165, 104, 154

[56] References Cited
U.S. PATENT DOCUMENTS

| 3,230,397 | 1/1966 | Linder | 307/237 |
| 3,267,296 | 8/1966 | Fuss | 307/358 X |

Primary Examiner—John Zazworsky
Attorney, Agent, or Firm—Martin E. Gerry

[57] ABSTRACT

A multi-channel adaptive threshold circuit usable to extract affirmative detection impulses from a plurality of detection circuits each having a different background noise level. The circuit comprises a plurality of analogous detection circuits whose outputs are coupled in parallel between a threshold circuit and threshold activation device such as a switch which grounds all outputs when in the ON position. The input to each detection circuit, which is a composite of sporadic affirmative return pulses and continuous background noise, is passed through a unidirectional conducting device, such as a base-to-emitter junction of a transistor, to charge a capacitor to a value which is a function of the continuous background noise. When the threshold activation device is turned off, the output plate of the capacitor of each detection circuit is applied to a fixed threshold circuit. Since a large value resistor coupled between the input plate and ground prevents rapid discharge of the capacitor, the potential across the plates remains substantially constant. The slow discharge results in a higher voltage on the input plate which causes the base-to-emitter junction to be back biased and thus nonconductive for almost all detection signal levels except high voltage pulses which are likely to indicate a positive detection return. Thus, each channel independently sets its own threshold level which is determined by the additional charge due to background noise across the capacitor just before the threshold activation switch is turned off. The signal threshold level in each detection circuit is then the sum of the additional potential across the capacitor of that detection circuit and the fixed threshold voltage established by the threshold circuit.

12 Claims, 4 Drawing Figures

ADAPTIVE THRESHOLD CIRCUIT

BACKGROUND OF THE INVENTION

1. Field of the Invention

The present invention relates to threshold circuits and particularly to multi-channel adaptive threshold circuits wherein the positive responses of all channels are combined and detected by a common threshold detection circuit without combining the noise of the respective channels.

2. Prior Art

In a multi-channel system such as a target detector, infrared, laser, or radar signals are generally detected, applied to individual threshold circuits and then combined in a logic array. While such an approach is generally effective, substantial circuit complexity and expense is involved. In order to alleviate such complexity and expense, simplified threshold circuits have been developed which combine the signals prior to the basic thresholding operation. However, this has been done with simple summing networks which sum the noise as well as the signals thereby causing a significant degeneration in the signal-to-noise ratio.

The present invention is a circuit configured such that the signals can be combined prior to the basic thresholding circuit without any significant loss in the signal-to-noise ratio while significantly decreasing the number of components which have been required by previous approaches. In addition, a simple adaptive threshold circuit is also provided as an integral part of the circuit with no additional parts required.

Although a single channel adapative threshold circuit such as that shown in FIG. 3 is known, in prior systems when a plurality of channels existed, each had its own independent thresholding circuit. However, the present invention makes use of the previously unrecognized fact that the signal-to-noise ratio is largely unaffected if a plurality of channels are coupled in parallel to a single thresholding circuit or that the noise of any single channel has very minimal influence on the thresholding capability of any other channel because each has its own individual adaptive thresholding capacitor which is charged solely from its own input signal.

SUMMARY OF THE INVENTION

In general, a plurality of detection circuits or channels are provided, each comprising a unidirectional conducting device such as the base-to-emitter junction in a transistor or a diode and a noise averaging circuit such as a capacitive circuit having a fall time which is slow relative to the frequency of the input signal. In each detection circuit, a noisy input signal flowing through the unidrectional conducting device initially charges one plate (hereinafter referred to as the input plate) of a capacitor to a particular voltage which is a function of the background noise on the input signal. The other plate (hereinafter referred to as the output plate) of the capacitor is coupled in parallel to the output plates of the capacitors of all other detection circuits between a threshold circuit and a threshold detection activation switch.

Initially, the activation switch is on, causing the output plates of each capacitor to be grounded through a small valued resistor. During this time, the voltage on the input plate of each capacitor is built up to a value which is a function of the background noise in that channel. At the interval where a positive detector return would occur, the activation switch is turned off allowing the signal on the output plates of all capacitors to be applied to the threshold circuit. Although a resistor coupled between the input plate and ground allows the capacitor in each channel to discharge, the capacitor and resistors in each channel are chosen so that the discharge time of the capacitor is slow relative to the charge time of the capacitor in that channel. Thus, a relatively constant potential difference across each capacitor over the time duration of interest is achieved which is equal to the average value of the input signal minus the forward voltage of the unidirectional conducting device plus a differential voltage, $V_a$, which results from the difference in the capacitor's charge and discharge times in response to peaks in the noisy input signal. The sum of the fixed threshold voltage plus the differential voltage $V_a$ is hereinafter referred to as the signal threshold level. Since the capacitor's input plate voltage will be the same as the voltage at the output of the unidirectional conducting device, a reverse biased state will usually exist because of the adaptive voltage differential $V_a$ thereby preventing all but the strongest signal pulses from passing through the channel. This provides an effective adaptive threshold circuit since a signal will be detected only if it has a voltage which exceeds the signal threshold level. Because of the relatively high value of the threshold voltage, the noise in each channel is substantially prevented from passage.

It is thus the general object of the present invention to provide an adaptive threshold circuit.

It is yet another object of the present invention to provide a multi-channel adaptive threshold circuit comprising a plurality of detection circuits coupled in parallel.

It is still another object of the present invention to provide an adaptive threshold circuit which has a minimum number of components.

Yet another object of the present invention is to provide an adaptive threshold circuit wherein a threshold level is automatically set which is substantially equal to a fixed threshold voltage plus an adaptive thresholding voltage.

It is still another object of the present invention to provide an adaptive threshold circuit which detects any signal impulse which exceeds an established threshold voltage without a significant loss of composite signal-to-noise ratio.

BRIEF DESCRIPTION OF THE DRAWINGS

A complete understanding of the present invention and of the above and other objects and advantages thereof may be gained from a consideration of the following detailed description taken in conjunction with the accompanying drawings in which.

DETAILED DESCRIPTION OF THE PREFERRED EMBODIMENTS

Figure 3:
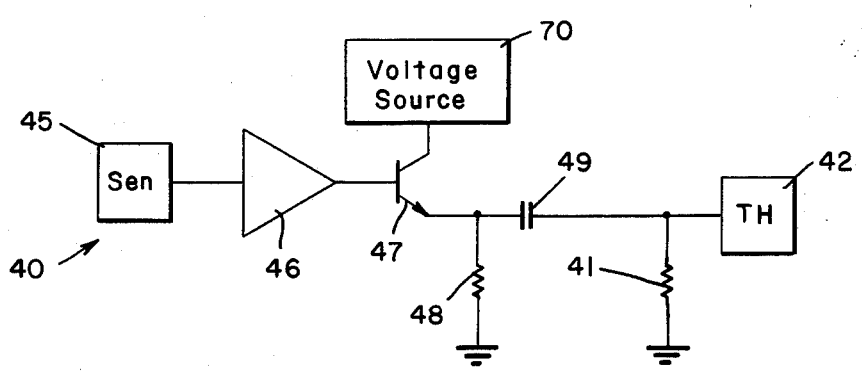
FIG. 3 is a simplified schematic of a prior art single channel adaptive threshold circuit.

In prior art circuits such as that shown in FIG. 3, circuit 40 comprises sensor 45 coupled to amplifier 46. Transistor 47 is coupled between voltage source 70 and ground through resistor 48. Coupled between the emitter of transistor 47 and resistor 48 is capacitor 49 which is coupled to threshold circuit 42 and to ground through resistor 41 which is small relative to resistor 48. As previously discussed, such a threshold circuit was previously limited to a single channel with each channel requiring a separate threshold circuit 42.

Figure 1:
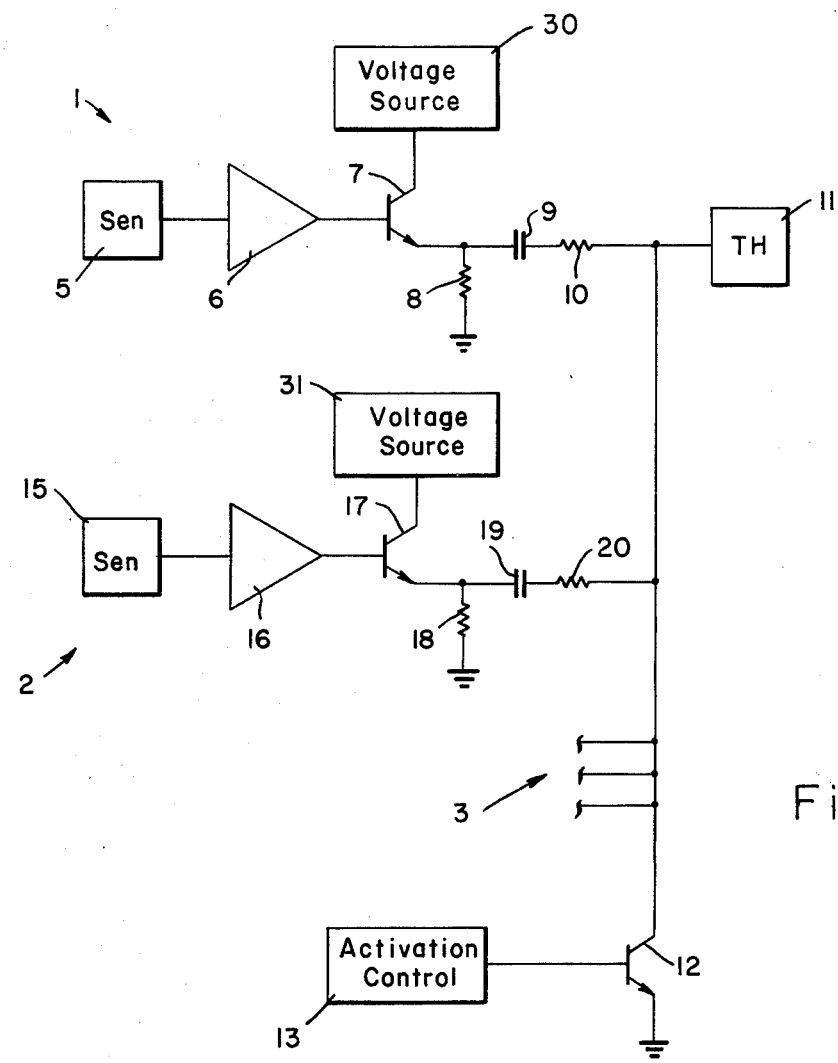
FIG. 1 is a simplified schematic of a multi-channel adaptive threshold circuit incorporating a plurality of detection circuits coupled in parallel.

Referring to FIG. 1 there is shown a simplified diagram of the multi-channel adaptive threshold circuit of the present invention comprising a plurality of detection channels 1, 2 and 3 whose outputs are coupled in parallel relationship between a threshold detection means 11 and a threshold detection activation means 12 controlled by activation control 13. For illustrative purposes, only detection channels 1 and 2 are shown in detail. However, it will be appreciated that any number of analagous channels 3 may be coupled in parallel relationship to complete a multi-channel adaptive threshold circuit. In channel 1 an infrared sensor, laser sensor, radar sensor, or other sensor 5 is coupled in serial relationship to amplifier 6 to form an input signal to drive unidirectional conducting means 7. While it is preferable that unidirectional conducting means 7 be a transistor whose base is driven by the input signal and whose collector is coupled to voltage source 30, it will be appreciated that the unidirectional conducting means may be a diode 7 with voltage source 30 eliminated. It will also be appreciated that the base-to-emitter junction may be either forward or reverse biased, and that the transistor may be either a PNP for negative signals or an NPN for positive signals depending upon the polarity of the output signal desired. The emitter of unidirectional conducting means 7 is coupled to a first adaptive means which comprises the serial combination of capacitor 9 and resistor 10 coupled in parallel with resistor 8 which is coupled between ground and the input plate of capacitor 9 to provide a capacitive discharge path through resistor 8.

Detection channel 2 is analagous to detection channel 1 and is oriented to receive a second input signal generated by sensor 15 and amplifier 16. Second unidirectional conducting means comprises a transistor whose base is driven by the second input signal and whose collector is coupled to second voltage source 31 which may be the same as first voltage source 30. The emitter of transistor 17 is coupled to a second adaptive means which comprises resistor 18 in parallel relationship to the serial combination of capacitor 19 and resistor 20 to provide a path for discharging capacitor 19 to ground through resistor 18.

Resistors 10, 20 and the analagous resistors of channels 3 are coupled together in parallel relationship to threshold detection means 11 and to threshold detection activation means 12. In the preferred embodiment, threshold detection activation means 12 is a switching transistor whose collector is coupled to resistors 10, 20 and analagous resistors of channels 3, whose base is coupled to switch control means 13, and whose emitter is coupled to ground. However, it will be appreciated that threshold detection activation means 12 may also be a small valued resistor 12'. In such a case, the output at the emitters of transistors 7 and 17 in channels 1 and 2 would have a low impedance when driving a positive signal and a high impedance when driving a negative signal or vice versa depending upon the particular orientation of the various components of the respective channels. This impedance differential allows an adaptive voltage differential to exist.

Figure 2:
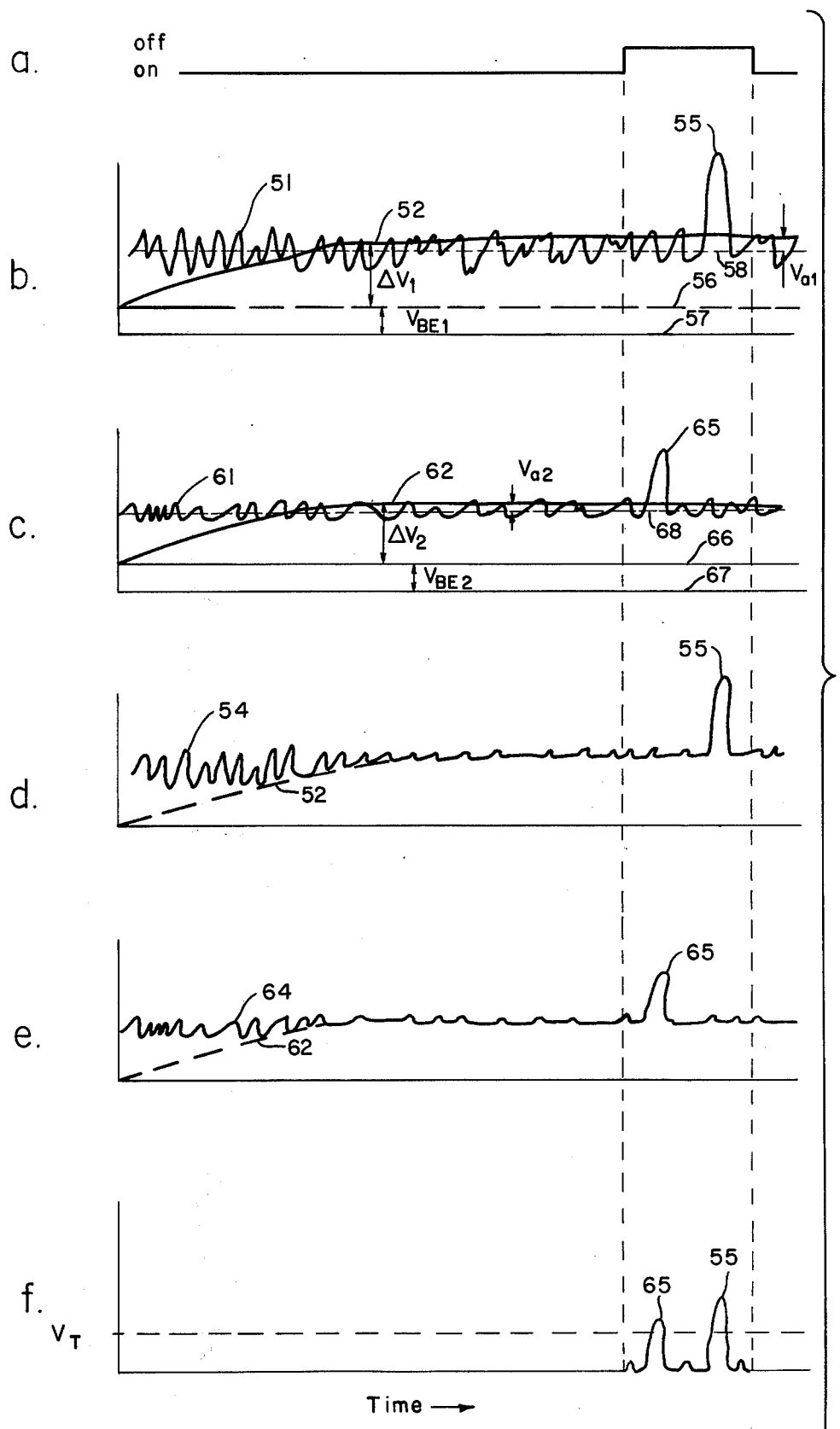
FIGS. 2a–2f are plots which illustrate the voltages of the signals as they appear at various points in the circuit of FIG. 1.
Figure 4:
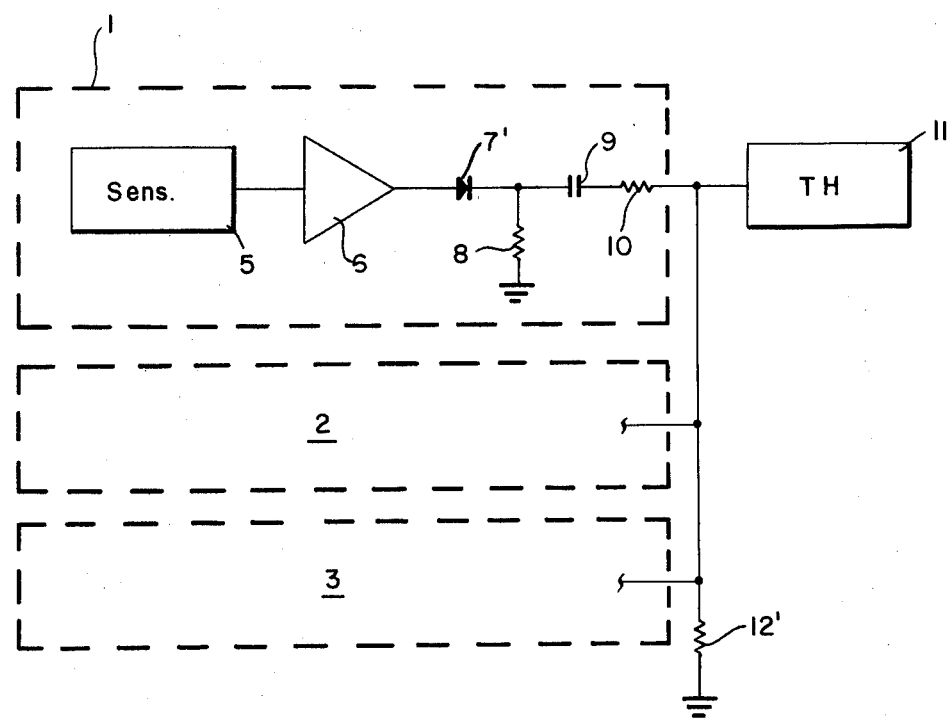
FIG. 4 is schematic showing the structure of the invention alternate to that shown in FIG. 1.

The operation of the circuit illustrated in FIG. 1 may be understood by reference to FIGS. 2a–2f. In FIG. 1 switch control means 13 keeps switch 12 in the conduction mode at all times except when a signal is anticipated. Since the emitter of switch 12 is coupled to ground, the outputs of each detection channel will be grounded when switch 12 is ON. A representative ON/OFF sequence for switch 12 is shown in FIG. 2a. As shown by FIG. 2f, when switch 12 is ON the collector and thus the output of each channel will be at ground. When switch 12 is OFF, the threshold detection capability is activated.

For simplicity in explaining the operation of the present invention, it will be assumed hereafter, that the present invention comprises only two detection channels. The plots 51 and 52 of FIG. 2b illustrate the detection signal waveform at two points in channel 1 while FIG. 2c illustrates the detection signals 61 and 62 at the corresponding points in channel 2 of FIG. 1. The input signals driving the base of transistor 7 and the base of transistor 17 are shown in FIG. 2b and 2c as curves 51 and 61 respectively. Since the respective detection signals have a positive voltage, they will initially flow through the forward biased base-to-emitter junctions of transistor 7 and 17 to charge capacitors 9 and 19, respectively as shown by curves 52 and 62 in FIGS. 2b and 2c. It will be appreciated that signals 52 and 62 as shown are relative to ground references 56 and 66 each of which is shown at one base-to-emitter voltage drop ($V_{BE1}$ and $V_{BE2}$ respectively) above the respective ground references 57 and 67 of the input signals 51 and 61. In operation, resistors 8 and 10 in channel one are chosen so that resistor 10 is much smaller than resistor 8. This permits the charge time of capacitor 9 through transistor 7 and resistor 10 to be faster than the discharge time through resistor 8. The ultimate charge built up on capacitor 9 while switch 12 is on (i.e., while the detection capability is deactivated) equals the average value 58 of the input signal 51 (or 68 of input signal 61) minus $V_{BE1}$ (or $V_{BE2}$ in FIG. 2c) plus the voltage, $V_{a1}$ ($V_{a2}$ in FIG. 2c), which is the adaptive voltage differential. Any value of resistors 8 and 10 may be used depending upon the adaptive voltage differential desired. In one instance, for example, resistor 8 was 75 KΩ and resistor 10 was 75 Ω. Resistors 18 and 20 in channel 2 and the resistors in channel 3 may be chosen in an analagous manner.

Referring now to curves 54 and 64 of FIGS. 2d and 2e, which represent the emitter outputs of transistors 7 and 17 respectively, the necessity for a unidirectional conducting junction may be understood. In FIG. 2d, for example, once the capacitor 9 has been fully charged to a voltage (represented by curve 52) which is eual to the average value of the input signal minus $V_{BE1}$ plus the adaptive threshold differential $V_{a1}$, the base-to-emitter junction will be forward biased only if the detection signal is greater than the capacitor voltage plus $V_{BE1}$. If the detection signal is below the voltage across the capacitor plus $V_{BE1}$, then the base-to-emitter junction will be reverse biased and no signal will flow through the junction. During this time, the capacitor slowly discharges through resistor 8. As previously noted, however, the time of this discharge will be much greater than the time it takes to recharge capacitor 9 when transistor 7 is conducting (i.e., forward biased). In addition, the resistors 8 and 10 should be chosen so that capacitor 9 will not loose a significant amount of charge while transistor 12 is OFF although this is not critical and will depend on the threshold effectiveness desired. This same process takes place in channel 2 and channel 3.

It will be appreciated that the input signals appearing in channels 1 and 2 will probably be different and thus the charge built up on capacitors 9 and 19 will be different. This difference is illustrated in FIGS. 2b and 2c by $\Delta V_1$ and $\Delta V_2$, respectively. Despite the fact that input signals are being continuously generated by channels 1 and 2, nothing will be detected by threshold circuit 11 so long as switch 12 is in the ON position since the output of each channel is grounded through switch 12. However, when switch 12 is turned OFF, the output of each channel is applied to threshold circuit. Because of the slow relative discharge of capacitors 9 and 19 through resistors 8 and 18, respectively, the voltage drop across the respective capacitors, $\Delta V_1$ and $\Delta V_2$, will remain at substantially the same value, both before and after switch 12 is turned OFF.

Since the value of the voltage at the emitter of the respective transistors (plus one base-to-emitter voltage drop, $V_{BE}$) will be greater than the average value of the voltage of the detection signal at the base, the transistor junction will remain reversed biased and the respective noise will not normally pass through the transistors. However, if a positive response is received as indicated by pulses 55 and 65, then the respective transistors will be forward biased and the signal will pass through and be detected by threshold circuit 11. An affirmative response is indicated by threshold circuit 11 whenever a voltage pulse occurs which is above the threshold voltage $V_T$ (supplied by threshold circuit 11) as illustrated by pulses 55 and 65 in FIG. 2f.

In some applications, it will be appreciated that activation control 13 and transistor 12 may be replaced by a resistor having a value which is small relative to the value of resistors 8, 18 and the corresponding resistors of channels 3 such as was done with resistor 41 shown in the prior art circuit of FIG. 3. In one embodiment, resistors 8 and 18 are 75K ohms and the replacement resistor is 100 ohms. It will be appreciated that these values may vary widely so long as the replacement resistor has a value which is sufficiently small so that the charge built up on capacitors 9 and 19 will be a function of the input noise. This will occur if capacitors 9 and 19 charge on the peaks of the input noise and do not substantially discharge through resistors 8 and 18 at non-peak values of the input noise.

If such a replacement resistor is utilized, resistors 10 and 20 of FIG. 1 may be eliminated without affecting the circuit's operation.

Summarizing, the channel with the highest signal drives the collector of switch 12. Therefore, if the signal in any one of the channels is larger than the threshold voltage $V_T$ plus the voltage across the capacitor in that channel, $\Delta V_1$ or $\Delta V_2$ in the present illustration plus one $V_{BE}$, $V_{BE1}$ or $V_{BE2}$, a threshold crossing will occur. Furthermore, the noise in the various channels does not add since the base-to-emitter junctions of all but one of the drive transistors, e.g., 7 and 17, are back biased preventing the input signal from passing therethrough.

While FIG. 1 represents the preferred embodiment of the present invention, it will be obvious to those skilled in the art, that changes and modifications may be made without departing from the invention in its broader aspects and therefore the aim in the appended claims is to cover all such changes and modifications as fall within the true spirit and scope of the invention.

What is claimed is:

1. A multi-channel adaptive threshold circuit to extract and combine information from a plurality of noisy input signals each generated by a signal reception means said adaptive threshold circuit comprising:

a plurality of detection channels for generating a detected signal at the output thereof, wherein each channel output is coupled in parallel relationship, each of the channels including:

unidirectional conducting means having an input coupled to said signal reception means to receive said input signal, and adaptive means coupled to the output of said unidirectional coupling means wherein the output of said adaptive means is the detection channel output;

threshold detection means coupled to the detection channel outputs for applying said detected signal thereto; and threshold enabling means coupled to the detection channel outputs and the threshold detection means for enabling said adaptive threshold circuit, wherein said threshold enabling means comprises a switch coupled between ground and said threshold detection means, and switch control means oriented to open and close said switch.

2. The multi-channel adaptive threshold circuit of claim 1, wherein said unidirectional conducting means in each channel comprises:

a transistor having a base-to-emitter junction wherein the base is the input and the emitter is the output of said unidirectional conducting means, and a voltage source coupled to the collector of said transistor to supply voltage thereto.

3. The multi-channel adaptive threshold circuit of claim 1, wherein said unidirectional conducting means is a diode.

4. The multi-channel adaptive threshold circuit of claim 1, wherein said adaptive means in each detection channel comprises:

a capacitor having an input plate and an output plate, said input plate being coupled to the output of the unidirectional conducting means, a first resistor coupled between ground and the input plate to allow the capacitor to discharge therethrough, and a second resistor coupled between the output plate of the capacitor and the threshold detection means.

5. The multi-channel adaptive threshold circuit of claim 4 wherein said first resistor has a value larger than said second resistor and said first resistor is sufficiently large that the charge across the capacitor is substantially constant while said threshold detection means is enabled.

6. The multi-channel adaptive threshold circuit of claim 4 wherein said threshold enabling means comprises a resistor coupled to ground having a value which is sufficiently small that the charge built up on the capacitors in the detection channels is a function of the input noise.

7. A multi-channel adaptive threshold circuit to extract and combine information from a plurality of noisy input signals each generated by a signal reception means said adaptive threshold circuit comprising:
- a plurality of detection channels for generating a detected signal at the output thereof, wherein each channel output is coupled in parallel relationship, each of the channels including:
  - unidirectional conducting means having an input coupled to said signal reception means to receive said input signal, and
  - adaptive means coupled to the output of said unidirectional coupling means wherein the output of said adaptive means is the detection channel output, and
- threshold detection means coupled to the detection channel outputs for applying said detected signal thereto, said adaptive means in each said detection channel comprising:
  - a capacitor having an input plate and an output plate, said input plate being coupled to the output of the unidirectional conducting means,
  - a first resistor coupled between ground and the input plate to allow the capacitor to discharge therethrough, and
  - a second resistor coupled between the output plate of the capacitor and the threshold detection means, and
- threshold enabling means coupled to the detection channel outputs and the threshold detection means for enabling said adaptive threshold circuit.

8. The multi-channel adaptive threshold circuit of claim 7 wherein said threshold enabling means comprises:
- a switch coupled between ground and said threshold detection means, and
- switch control means oriented to open and close said switch.

9. The multi-channel adaptive threshold circuit of claim 7, wherein said unidirectional conducting means in each channel comprises:
- a transistor having a base-to-emitter junction wherein the base is the input and the emitter is the output of said unidirectional conducting means, and
- a voltage source coupled to the collector of said transistor to supply voltage thereto.

10. The multi-channel adaptive threshold circuit of claim 7, wherein said unidirectional conducting means is a diode.

11. The multi-channel adaptive threshold circuit of claim 7, wherein said first resistor has a value larger than said second resistor and said first resistor is sufficiently large that the charge across the capacitor is substantially constant while said threshold detection means is enabled.

12. The multi-channel adaptive threshold circuit of claim 7 wherein said threshold enabling means comprises a resistor coupled to ground having a value which is sufficiently small that the charge built up on the capacitor is a function of the input noise.

* * * * *